United States Patent
Hu et al.

(10) Patent No.: US 8,438,989 B2
(45) Date of Patent: *May 14, 2013

(54) SURFACE FEED-IN ELECTRODES FOR DEPOSITION OF THIN FILM SOLAR CELL AND SIGNAL FEED-IN METHOD THEREOF

(75) Inventors: Shengming Hu, Shenzhen (CN); Yi Li, Shenzhen (CN); Zhubing He, Shenzhen (CN); Zhijian Li, Shenzhen (CN); Jianhua Zhou, Shenzhen (CN); Chunzhu Wang, Shenzhen (CN)

(73) Assignee: Shenzhen TRONY Science & Technology Development Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/698,864

(22) PCT Filed: Oct. 21, 2010

(86) PCT No.: PCT/CN2010/001657
§ 371 (c)(1),
(2), (4) Date: Nov. 19, 2012

(87) PCT Pub. No.: WO2011/153673
PCT Pub. Date: Dec. 15, 2011

(65) Prior Publication Data
US 2013/0063028 A1 Mar. 14, 2013

(30) Foreign Application Priority Data
Jun. 11, 2010 (CN) .......................... 2010 1 0198723

(51) Int. Cl.
*H01J 1/00* (2006.01)
*H05H 1/24* (2006.01)

(52) U.S. Cl.
USPC ........ 118/500; 315/85; 315/111.21; 313/326; 118/723 E

(58) Field of Classification Search .................. 118/500; 315/85
See application file for complete search history.

(56) References Cited

U.S. PATENT DOCUMENTS

| | | | | |
|---|---|---|---|---|
| 8,291,858 B2 * | 10/2012 | Hu et al. | .................. | 118/723 E |
| 8,297,226 B2 * | 10/2012 | Li | ............... | 118/723 E |
| 8,356,572 B2 * | 1/2013 | Li | ................... | 118/500 |

* cited by examiner

*Primary Examiner* — Sylvia R MacArthur
(74) *Attorney, Agent, or Firm* — Anova Law Group, PLLC

(57) ABSTRACT

The present invention discloses a surface feed-in electrode structure for thin film solar cell deposition, relating to solar cell technologies. The surface feed-in electrode structure uses a signal feed-in component with a flat waist and a semicircular feed-in end to connect the signal feed-in port by surface contact. The signal feed-in port is located in a hallowed circular area of a center of the backside of a cathode plate, and feeds in an RF/VHF power supply signal. An anode plate is grounded. The cathode plate is insulated with a shielding cover, and a through-hole is configured on the shielding cover. The effects include that, by using the surface feed-in at the center of the electrode plate, the feeding line loss of single-point or multi-point feed-in configurations can be overcome. Uniform large area and stable discharge driven by the RF/VHF power supply signal can be achieved, and the standing wave and the skin effect can be effectively removed. The production efficiency can be improved and the cost can be reduced.

16 Claims, 3 Drawing Sheets

SURFACE FEED-IN ELECTRODES FOR DEPOSITION OF THIN FILM SOLAR CELL AND SIGNAL FEED-IN METHOD THEREOF

FIELD OF THE INVENTION

The present invention generally relates to solar cell technologies and, more particularly, to electrodes used in a very high frequency (VHF) driven silicon-based thin film solar cell deposition chamber.

BACKGROUND

Currently, silicon-based thin film solar cells often use plasma enhanced chemical vapor deposition (PECVD) to construct single-junction or multi junction photovoltaic PIN film layers. This type of radio-frequency (RF) capacitively-coupled parallel plate reactor is commonly used for making large-area thin film deposition of various materials, such as amorphous silicon, amorphous silicon-germanium, silicon carbide, silicon nitride and silicon oxide, etc. In the thin film solar cell industry, the electrode with a supporting frame is usually called a clamping unit, a holder, or a fixture, and the plasma chemical vapor deposition apparatus with installed holder(s) inside the chamber is often called the "deposition box," i.e., the reactor chamber.

The silicon thin film solar cell sector is an important branch of the solar industry, and the holder becomes one of the core equipment of the solar industry. The 13.56 MHz RF is widely used in high-speed amorphous silicon thin film deposition and have high efficiency and low process cost. With the rising demand for silicon thin film technology, more attention has been given to microcrystalline and nanocrystalline silicon thin film materials.

However, in a microcrystalline environment, plasma generated by 13.56 MHz RF may have low plasma concentration, low deposition rate, long deposition period to reach targeted film thickness, and significant background pollution. Thus, the prepared thin film often has high impurity and poor optical properties, which seriously affects the quality and performance of the products. How to make high-speed deposition becomes key for crystalline silicon thin-film technology to successfully serve the industry.

Very high frequency (VHF) is referred to the legitimate frequency which is twice or more of 13.56 MHz. In the industry, the VHF mostly used is generally in the range of 27.12~100 MHz. However, in the capacitive discharge model, standing wave effect and skin effect caused by VHF become very obvious, and these effects become stronger when the driving frequency increases. Professor M. A. Lieberman of University of California, Berkeley made a thorough investigation on these two effects. His research results show that the critical condition for VHF PECVD deposition of uniform thin films is that the free space wavelength of excitation frequency ($\lambda_0$) is much larger than the capacitive discharge electrode chamber size factor (X), and the skin depth ($\delta$) is much larger than the thickness tolerance factor ($\eta_0$). For example, on 1 m² of discharging area and with an excitation frequency of 60 MHz, $\lambda_0 \approx X$ and $\delta \approx \eta$. Therefore, under this excitation frequency, the skin effect and the standing wave effect become very obvious, leading to an uneven discharge on the electrode plate of 1 m². Thus, how to achieve a large area of uniform discharge driven by VHF is one of the technical problems to be resolved for the crystalline silicon thin-film technology.

This also caused great interest in the industry. In 2003, U.S. Patent 2003/0150562A1 disclosed a method using a magnetic mirror in the capacitively-coupled discharge to improve the inhomogeneity caused by VHF. Chinese patents 200710150227.4, 200710150228.9, and 200710150229.3 disclosed three electrode designs of VHF, applying different feed-in forms of VHF signals to obtain uniform electric fields.

However, the following problems may still remain: 1) The electrodes in the VHF-PECVD chamber have complex design structures; 2) One reason for the continuous improvement is that the constant assembly/disassembly and cleaning of the reaction chamber and electrodes can cause abnormal deformation of the electrodes; 3) The multi-point feed-in structures disclosed in the existing patents may have a small contact surface, which requires symmetrical paths of individual feed-in points and there is no contact between the bonding conductors at the feed-in points and the cathode plate. More specifically, a shield of isolation may be needed between the bonding conductor and the cathode plate for effective discharge. These structural designs have relatively harsh actual requirements, have too many determination factors for uniform discharge, and cannot meet the actual production needs such as disassembly and cleaning.

Therefore, for the equipment used by the industry, a single point feed-in becomes the mainstream design. But due to the standing wave effect and the skin effect, current single-point feed-in structures cannot meet the requirement for increasing the high feed-in frequency. Thus, further development and improvement may be needed to make the existing deposition holders and electrodes more practical to meet the current market demand and to reduce the cost. Meanwhile, it is also a trend to use CVD electrode components capable of processing or depositing multiple glasses. Therefore, it is of great practical significance for the industry to apply an effective VHF feed-in model to meet the demand of mass production and to enter the industrial production stage.

CONTENTS OF THE INVENTION

The present invention intends to solve the problems such as the discharging non-uniformity of the VHF-driven power supply and to provide new types of electrodes to obtain consistent electric fields in a large-area VHF-PECVD deposition chamber. Such solutions can be used to create large-area multi-electrode VHF-PECVD electrode array for mass production of thin film solar cells.

To solve problems of the prior art, the disclosed technical solutions include: an electrode plate component and a signal feed-in port configured on the electrode plate component, an anode plate of the electrode plate component is connected to a positive end of a power supply signal and is grounded, and the signal feed-in port is located in a hallowed circular area at a center area of a backside of a cathode plate. They further include:

A signal feed-in component is connected to the signal feed-in port by surface contact and to a negative end of a radio frequency (RF) or very high frequency (VHF) power supply signal;

The RF/VHF power supply signal is fed in a surface feed-in mode;

One end of the signal feed-in component is in a semicircular shape; and

A through-hole is configured on a shielding cover of the cathode plate.

The signal feed-in component includes an insulation layer and an outer shielding layer, is a step-shaped conductive strip having a waist and a head. The waist is flat and the head is semicircular-shaped. The signal feed-in component includes a copper feed-in core, an insulating layer, and an outer shielding layer.

The electrode plate in the disclosed solutions includes a single-surface discharging cathode plate, a ceramic insulation layer, and a shielding cover. The shielding cover covers entire back and side surfaces of the cathode plate. The electrode plate component also includes a ground for grounding the shielding cover and the anode plate, and the cathode plate and the anode plate are separated by a certain discharging distance. The shielding cover includes shielding of a center position of backside and surrounding sides of the cathode plate for feeding in the RF/VHF power supply signal. One end of the signal feed-in component is connected with a negative output port of the RF/VHF power supply signals and a power supply matching device.

Further, the disclosed technical solutions include a signal feed-in method for a electrode plate component, providing an electrode plate component having a signal feed-in port configured on the electrode plate component; and feeding in a radio frequency (RF) or very high frequency (VHF) power supply signal by a surface feed-in mode.

The surface feed-in mode is realized by using a signal feed-in component to connect the signal feed-in port by surface contact to feed in the RF/VHF power supply signal;

The signal feed-in port is located in a hallowed circular area at a center area of a backside of a cathode plate; and A through-hole is configured on a shielding cover of the cathode plate.

The shielding cover of the cathode plate is configured with the through-hole to prevent the signal feed-in component from contacting the shielding cover when coming out the through-hole.

The beneficial effects of the present invention, different from the slot-type cathode plate with side feed modes, include that the present invention can achieve the higher uniformity, greater discharge area and the stable discharge performance. Further, the connection capacitance is smaller, the actual discharge power is greater, and the radio frequency interference between electrode plate arrays is smaller. Also different from cathode plate center-point-type feed mode of the single chamber deposition system, the connection capacitance is smaller, the standing wave and the skin effect is smaller, and the integrated array type multi-chamber deposition can be obtained to greatly improve production efficiency. Therefore, through optimizing VHF power feed-in form and electrode plate structure, the solution of RF/VHF discharge uniformity can be obtained, and it is the premise of high efficient preparation technology for crystallized silicon thin film. The invention is applicable for any power and any legitimate VHF frequencies in the range of 27.12 MHz~200 MHz for large area uniform discharge. This structure can be applied to multiple-glasses deposition systems for greatly improving the productivity and reducing the cost of solar cells. The invention breaks through the conventional electrode design technical limitations, effectively eliminates the VHF inducing effects such as a standing wave and the skin effect, and improves uniform discharge to industrial application level.

BRIEF DESCRIPTION OF THE DRAWINGS

In FIG. 1-7, electrode plat components and signal feed-in components are installed in reaction chamber 02. The reaction chamber 02 includes bottom back-door plate 211, upper back-door plate 212, a front door panel 215, the side frame 216, a bottom base plate 221, and gas cavity 214. Bottom base plate 221 and gas cavity 214 have grounded metal guide grooves 209. The electrode plate component includes anode plates 208, cathode plates 203, and insulation layer 207 placed between a cathode plate 203 and cathode shielding cover 204. The cathode shielding cover 204 and anode plates 208 are grounded.

Figure 1:
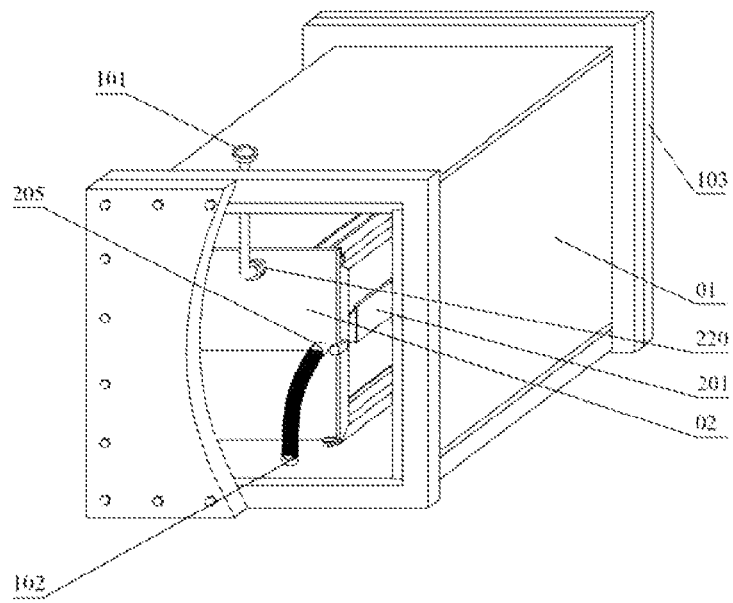
FIG. 1 is a structural diagram of the first embodiment of the present invention.
Figure 2:
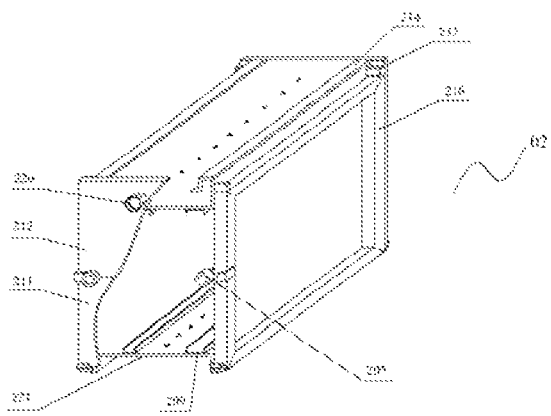
FIG. 2 is a structural diagram of reaction chamber 01.
Figure 3:
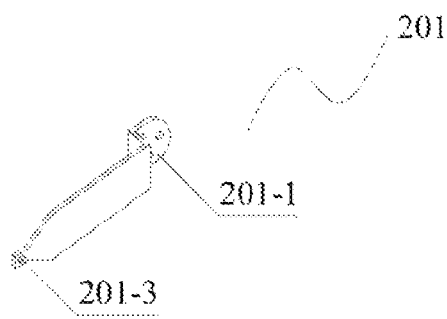
FIG. 3 is a structural diagram of signal feed-in component 201 of FIG. 1.
Figure 4:
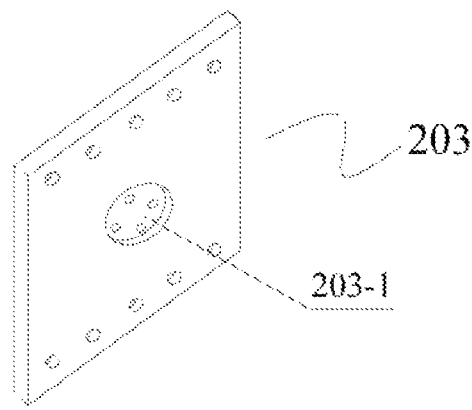
FIG. 4 is a structural diagram of cathode plate 203.
Figure 5:
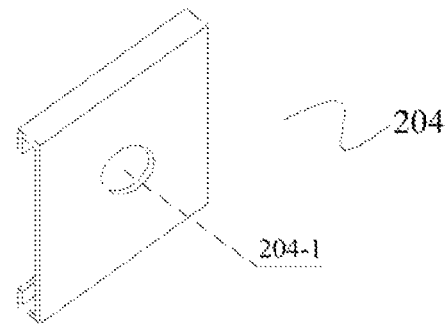
FIG. 5 is a structural diagram of cathode shielding cover 204.

The step-shaped signal feed-in component includes a waist with high-temperature tolerant outer insulating and shielding layer 202 and a head (or end) with semicircular-shaped signal feed-in surface 201-1. The semicircular feed-in surface 201-1 corresponds to a circular surface feed-in port 203-1 located at a hollowed circular area at the center of the backside of the cathode electrode plate 203 with cathode shielding cover 204. The waist of the signal feed-in component is flat for easy installation and low feed-in signal loss. The reaction chamber discharges inside the vacuum chamber 01, depositing P-I-N film layers on substrates 206. The vacuum chamber 01 contains the gas system feed-in inlet 101, the power supply feeding system inlet 102, vacuum chamber door 103, track 104, and vacuum system feed-in inlet 105.

According to the present invention, the design of surface feed-in electrodes achieves the purposes of the present invention mentioned above, which overcomes many difficult-to-solve problems of the existing multi-point feed-in VHF-PE-VCD deposition techniques for crystalline silicon-based thin films, such as the complex electrode structures of the reaction chamber, easy electrode deformation, small contact area, and requiring symmetrical paths among individual feed-in points and complete shielding, etc. These problems do not exist in the surface feed-in electrode design according to the present invention, and large area of uniform electric fields can be obtained to discharge electricity inside the chamber. Further, the CVD discharge electrode system is capable of processing or depositing multiple glass plates, with effective VHF surface feed-in mode, to achieve operational industrial production processes and to meet the needs of mass production of the silicon-based thin film solar cells.

The contributions of the present invention also include providing fundamental solutions to the uniformity and consistency of VHF power-driven high-speed deposition film. The electrode plat components and signal feed-in components are installed in reaction chamber 02. The reaction chamber 02 discharges inside the vacuum chamber 01. The reaction chamber 02 includes bottom back-door plate 211, upper back-door plate 212, a front door panel 215, the side frame 216, bottom base plate 221, and gas cavity 214. Bottom base plate 221 and gas cavity 214 have grounded metal guide grooves 209. The insulation layer 207 is placed between cathode plate 203 and cathode shielding cover 204. The cathode shielding cover 204 and anode plates 208 are grounded.

The signal feed-in component includes a waist and an end 201-1, which is in a semicircular shape and corresponds to feed-in port 203-1 located at a hallowed circular area at the center of the cathode electrode plate 203 with cathode shielding cover 204. The waist of the signal feed-in component is flat for easy installation and low feed-in signal loss. The other end 201-3 of the signal feed-in component 201 connects to the negative port of the RF/VHF power supply and a power matching device (not shown). The signal feed-in component 201 is of a stair or step shape and one semi-circular end makes surface contact and connects with the feed-in port of the electrode plate component to form the electrode plate component in the grounded reaction chamber 02, both of them having insulation and shielding protective devices (not shown).

DETAILED DESCRIPTION OF THE EMBODIMENTS

The First Embodiment

The electrode plates are arranged vertically, and the feed-in port of cathode is of a circular shape and is located in a hollowed circular area at the center of the backside of the cathode electrode plate. The signal feed-in component includes a flat waist and one end with a semicircular-shaped signal feed-in surface. A through-hole is configured on the cathode shielding cover.

The principles of this embodiment are illustrated together with accompanying FIGS. 1-6. The vapor deposition system mainly includes a vapor deposition chamber, a gas system, an electrical power system, a vacuum system, a heating system, a control system, and so on. The gas system mainly provides different gases and gas lines for vapor deposition. The electrical power system mainly provides high-frequency or very-high-frequency electrical power source to discharge plasma for film deposition. The vacuum system mainly provides vacuum pumping machines and vacuum pipelines. The heating system mainly supplies heat for vapor deposition chamber. The control system mainly controls the parameters of deposition process. The vapor deposition chamber is the apparatus for realizing thin film deposition with gases on substrate 206.

The vapor deposition chamber mainly comprises vacuum chamber 01, reaction chamber 02, electrode plate components, and signal feed-in components. Vacuum chamber 01 is used to achieve vacuum. Reaction chamber 02 is used to discharge plasma and deposit P-I-N thin film layers on substrate 206. Reaction chamber 02 includes bottom back-door plate 211, upper back-door plate 212, front door panel 215, side frame 216, bottom base plate 221, and gas cavity 214. Bottom base plate 221 and gas cavity 214 have grounded metal guide grooves 209. The insulation layer 207 is placed between cathode plate 203 and cathode shielding cover 204.

The step-shaped signal feed-in component includes a waist with high-temperature tolerant outer insulating and shielding layer 202 and a head with semicircular-shaped signal feed-in surface 201-1. The semicircular feed-in surface 201-1 corresponds to a circular surface feed-in port 203-1 located at a hollowed circular area at the center of the backside of the cathode electrode plate 203 with cathode shielding cover 204. The waist of the signal feed-in component is flat for easy installation and low feed-in signal loss. The reaction chamber discharges inside the vacuum chamber 01, depositing P-I-N film layers on substrates 206. The vacuum chamber 01 contains the gas system feed-in inlet 101, the power supply feeding system inlet 102, vacuum chamber door 103, track 104, and vacuum system feed-in inlet 105

The semicircular feed-in surface 201-1 of one end of the signal feed-in component 201 is in surface contact with the feed-in port 203-1 located on the hallowed circular area on the center of the backside of cathode plate 203 to feed-in RF/VHF power supply signals. The through-hole 201-3 at the other end of the feed-in component 201 is connected with the power connector 205. The waist of the signal feed-in component 201 is covered by a high-temperature tolerant insulation and shielding layer 202 to prevent the feed-in component 201 from contacting the cathode shielding cover 204.

The cathode shielding cover 204 has a through hole 204-1 corresponding to the location of the feed-in port 203-1 of cathode plate 203 such that the signal feed-in component 201 can come out of the cathode plate 203 without contacting the cathode shielding cover 204. The feed-in component 201 may be made of a strip or sheet of metal copper with desired conductivity, and both the cathode shielding cover 204 and the anode plates 208 are grounded.

The pre-coated substrates 206 are placed in the reaction chamber 02, and the reaction chamber 02 is placed into the vacuum chamber 01. The moveable door 103 of the vacuum chamber 01 is then closed. The entrance of the fixed gas pipe on the reaction chamber 02 is connected with the nozzle of the gas system port 101 inside the vacuum chamber 01, and one end of the power cord is connected with the power connector 205 of reaction chamber 02, and the other end of the power cord is connected with the access port 102 of VHF power system.

Further, a desired vacuum state can be reached through the vacuum system. An argon gas is then filled in the chamber. When the pressure in the chamber reaches approximately 60 Pa, the VHF power supply is turned on to discharge electricity to clean the chamber, and the power is turned off thereafter. Further, a high-degree of vacuum of approximately $5.0 \times 10^{-4}$ Pa is reached, and argon gas is filled in to clean the chamber. Finally, the process gas is fed in the reaction chamber at approximately 5 slpm to start the deposition process and to complete vapor deposition film on the substrates.

The Second Embodiment

The feed-in port of the cathode plate is of a circular shape and is located on a circular surface of a hollowed circular area at the center of the backside of the cathode electrode plate. The signal feed-in component includes a flat waist and one end with a semicircular-shaped signal feed-in surface. A through-hole is configured on the cathode shielding cover.

Figure 6:
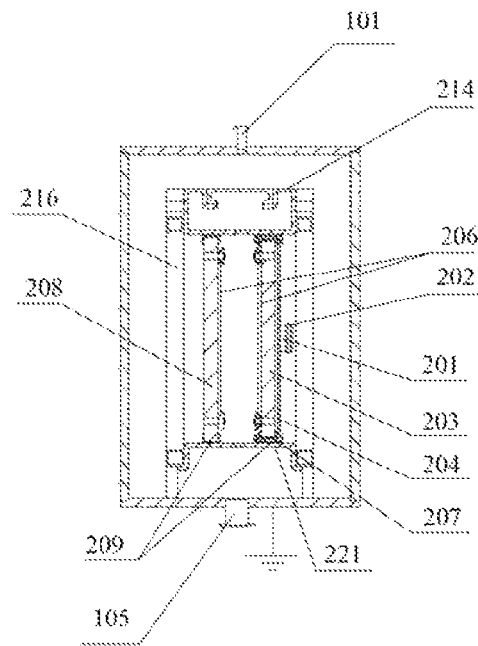
FIG. 6 is a structural diagram of the second embodiment of the present invention.

As shown in FIG. 6, a vertically-arranged reaction chamber is used. An anode plate 208 and a cathode plate 203 form a set of electrodes, and a total of 2 substrates 206 can be deposited with thin film simultaneously. More specifically:

a) Placing 2 glass substrates 206 (1640 mm×707 mm×3 mm) each coated with a transparent conductive film of approximately 600 nm thickness in the corresponding 2 substrate locations on the reaction chamber 02, with the film side facing outside and the glass side facing the electrode plates.

b) When reaching a vacuum state of approximately $5.0 \times 10^{-4}$ Pa inside the vacuum chamber, filling in argon gas. When the pressure inside the chamber reaches approximately 60 Pa, turning on the 40.68 MHz VHF power supply, discharging at 400 W to clean the chamber for 2 minutes, and turning off the power supply.

c) Reaching a high-degree vacuum state of approximately $5.0 \times 10^{-4}$ Pa and cleaning the chamber twice with argon gas.

d) Pumping in a gas mixture (silane and hydrogen) at 5 slpm into the chamber and, when the pressure inside the chamber reaches approximately 60 Pa, turning on the 40.68 MHz VHF power supply. Further, discharging at 400 W and depositing microcrystalline silicon intrinsic layer for 40 minutes.

e) Turning off the power supply and reaching a high-degree vacuum state.

f) Filling the chamber with nitrogen gas to atmosphere pressure, opening the vacuum chamber movable door 103, moving out the reaction chamber 02, and cooling the TCO glasses at room temperature.

The Third Embodiment

The feed-in port of the cathode plate is of a circular shape and is located on a circular surface of a hollowed circular area at the center of the backside of the cathode electrode plate. The signal feed-in component includes a flat waist and one end with a semicircular-shaped signal feed-in surface. A through-hole is configured on the cathode shielding cover.

Figure 7:
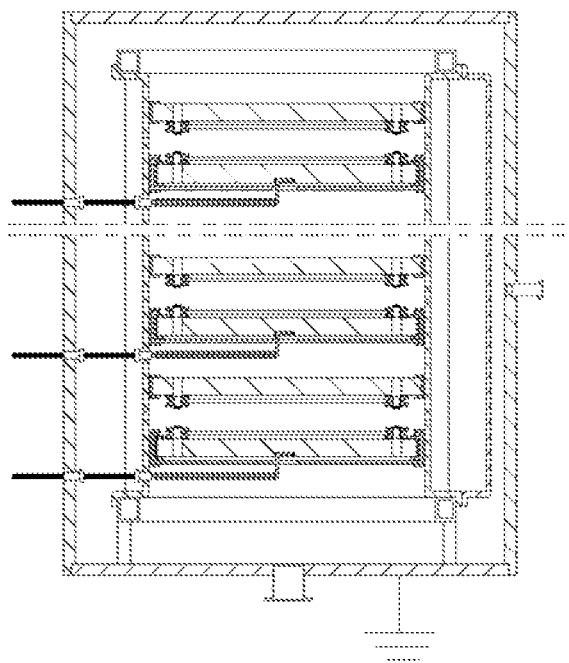
FIG. 7 is a structural diagram of the third embodiment of the present invention.

As shown FIG. 7, a horizontal reaction chamber is used. Eight (8) anode plates 208 and eight (8) cathode plates 203 form 8 sets of electrodes, and a total 16 substrates 206 can be deposited with thin film simultaneously. The detailed procedure is described as follows:

a) Placing 16 glass substrates 206 (1640 mm×707 mm×3 mm) each coated with a transparent conductive film of approximately 600 nm thickness in the corresponding 16 substrate locations on the reaction chamber 02, with the film side facing outside and the glass side facing the electrode.

b) When reaching a vacuum state of approximately $5.0 \times 10^{-4}$ Pa inside the vacuum chamber, filling in argon gas. When the pressure inside the chamber reaches approximately 60 Pa, turning on the 40.68 MHz VHF power supply, discharging at 400 W to clean the chamber for 2 minutes, and turning off the power supply.

c) Reaching a high-degree vacuum state of approximately $5.0 \times 10^{-4}$ Pa and cleaning the chamber twice with argon gas.

d) Pumping in a gas mixture (silane and hydrogen) at 5 slpm into the chamber and, when the pressure inside the chamber reaches approximately 60 Pa, turning on the 40.68 MHz VHF power supply. Afterward, discharging at 400 W and depositing microcrystalline silicon intrinsic layer for 40 minutes.

e) Turning off the power supply and reaching a high-degree vacuum state.

f) Filling the chamber with nitrogen gas to atmosphere pressure, opening the vacuum chamber movable door 103, moving out the reaction chamber 02, and cooling the TCO glasses at room temperature.

The above detailed explanations illustrate embodiments of the present invention together with accompanying figures. However, the present invention is not limited by the embodiments, especially with respect to the shapes of the feed-in components and cathode plates. Those of ordinary skill in the art can make various changes without departing from the principles and purposes of the present invention.

What is claimed is:

1. A surface feed-in electrode structure for silicon thin-film solar cell deposition, comprising:
    an electrode plate component having an anode plate and a cathode plate; and
    a signal feed-in port configured on the electrode plate component,
    wherein:
    the anode plate of the electrode plate component is connected to a positive end of a power supply signal and is grounded;
    the signal feed-in port is located in a hallowed circular area at a center area of a backside of the cathode plate;
    a signal feed-in component is connected to the signal feed-in port by surface contact and to a negative end of a radio frequency (RF) or very high frequency (VHF) power supply signal;
    the RF/VHF power supply signal is fed in a surface feed-in mode;
    one end of the signal feed-in component is in a semicircular shape; and
    a through-hole is configured on a shielding cover of the cathode plate.

2. The surface feed-in electrode structure for silicon thin-film solar cell deposition according to claim 1, wherein:
    the signal feed-in component includes an insulation layer and an outer shielding layer.

3. The surface feed-in electrode structure for silicon thin-film solar cell deposition according to claim 2, wherein:
    the signal feed-in component is a step-shaped conductive strip having a waist and a head.

4. The surface feed-in electrode structure for silicon thin-film solar cell deposition according to claims 3, wherein:
    the sign feed-in component includes a flat waist and a semicircular-shaped head.

5. The surface feed-in electrode structure for silicon thin-film solar cell deposition according to claim 2, wherein:
    the signal feed-in component includes an insulation layer and an outer shielding layer.

6. The surface feed-in electrode structure for silicon thin-film solar cell deposition according to claims 2, wherein:
    the signal feed-in component includes a flat waist and a semicircular-shaped head.

7. The surface feed-in electrode structure for silicon thin-film solar cell deposition according to any of claim 1, wherein:
    the signal feed-in component includes a flat waist and a semicircular-shaped head.

8. The surface feed-in electrode structure for silicon thin-film solar cell deposition according to claim 1, wherein:
    the signal feed-in component includes a copper feed-in core, an insulating layer, and an outer shielding layer.

9. The surface feed-in electrode structure for silicon thin-film solar cell deposition according to claim 1, wherein:
    the electrode plate component includes a single-surface discharging cathode plate, a ceramic insulation layer, and a shielding cover.

10. The surface feed-In electrode structure for silicon thin-film solar cell deposition according to claim 1, herein:
    the shielding cover covers entire back and side surfaces of the cathode plate.

11. The surface feed-in electrode structure for silicon thin-film solar cell deposition according to claim 1, wherein:
    the electrode plate component includes a ground for grounding the shielding cover and the anode plate, the cathode plate and the anode plate being separated by a certain discharging distance.

12. The surface feed-in electrode structure for silicon thin-film solar cell deposition according to claim 1, wherein:
    the shielding cover includes shielding of a center position of backside and surrounding sides of the cathode plate for feeding in the RF/VHF power supply signal.

13. The surface feed-in electrode structure for silicon thin-film solar cell deposition according to claim 1, wherein:
    one end of the signal feed-in component is connected with a negative output port of the RF/VHF power supply signals and a power supply matching device.

14. The signal feed-in method for a surface feed-in electrode structure for silicon thin-film solar cell deposition according to claim 12, wherein:
    the shielding cover of the cathode plate is configured with the through-hole to prevent the signal feed-in component from contacting the shielding cover when coming out the through-hole.

15. The signal feed-in method for a surface feed-in electrode structure for silicon thin-film solar cell deposition according to claim 12, wherein:
   the signal feed-in component is a step-shaped conductive strip having a waist and a head.

16. A signal feed-in method for a surface feed-in electrode structure for silicon thin-film solar cell deposition, comprising:
   providing an electrode plate component having a signal feed-in port configured on the electrode plate component; and
   feeding in a radio frequency (RF) or very high frequency (VHF) power supply signal by a surface feed-in mode, wherein:
   the surface feed-in mode is realized by using a signal feed-in component to connect the signal feed-in port by surface contact to feed in the RF/VHF power supply signal;
   the signal feed-in port is located in a hallowed circular area at a center area of a backside of a cathode plate; and
   a through-hole is configured on a shielding cover of the cathode plate.

\* \* \* \* \*